United States Patent
Kimura

[11] Patent Number: 5,319,264
[45] Date of Patent: Jun. 7, 1994

[54] LOGARITHMIC AMPLIFYING CIRCUIT

[75] Inventor: Katsuji Kimura, Tokyo, Japan

[73] Assignee: Nec Corporation, Tokyo, Japan

[21] Appl. No.: 97,731

[22] Filed: Jul. 27, 1993

Related U.S. Application Data

[63] Continuation of Ser. No. 784,502, Oct. 30, 1991, abandoned.

[30] Foreign Application Priority Data

Oct. 30, 1990 [JP] Japan .................................. 2-292866

[51] Int. Cl.$^5$ ......................... G06F 7/556; G06F 7/24
[52] U.S. Cl. ..................................... 307/492; 307/495;
328/145; 328/26; 328/32; 330/253; 330/2
[58] Field of Search ............... 307/492, 494, 495, 497;
328/145, 26, 32; 330/253

[56] References Cited

U.S. PATENT DOCUMENTS

| | | | |
|---|---|---|---|
| 4,680,553 | 7/1987 | Kimura et al. ........................... | 330/2 |
| 4,972,512 | 10/1990 | Garskamp ........................... | 307/492 |
| 4,990,803 | 2/1991 | Gilbert ............................... | 328/145 |
| 5,049,829 | 9/1991 | Garskamp et al. ................. | 307/492 |
| 5,057,717 | 10/1991 | Kimura .............................. | 328/145 |

FOREIGN PATENT DOCUMENTS 62-292010 12/1987 Japan .
3228412 10/1991 Japan .

Primary Examiner—Timothy P. Callahan
Assistant Examiner—Toan V. Tran

[57] ABSTRACT

In a logarithmic amplifier circuit including a plurality of cascaded differential amplifiers, a plurality of blocks of logarithmic full-wave rectifiers are provided, each producing output currents having logarithmic full-wave rectification characteristics in respect to voltages of their input signals. Each logarithmic full-wave rectifier is formed by a plurality of squaring full-wave rectifiers each producing an intermediate current having squaring full-wave characteristics. A current adder is provided for each or a group of the squaring full-wave rectifiers to add up the intermediate currents thereof and produce an output current. A common adder is provided for adding the output currents from all logarithmic full-wave rectifiers to produce a current output signal.

5 Claims, 5 Drawing Sheets

LOGARITHMIC AMPLIFYING CIRCUIT

This is a continuation, of application Ser. No. 784,502, filed Oct. 30, 1991, now abandoned.

BACKGROUND OF THE INVENTION

1. Field Of The Invention

The present invention relates to a logarithmic amplifying circuit and, more particularly, to a logarithmic amplifying circuit suited for a MOS integrated circuit.

2. Description Of The Related Arts

A conventional logarithmic amplifying circuit of the type is generally realized in a bipolar integrated circuit. A logarithmic amplifying circuit realized in a MOS integrated circuit is disclosed in, e.g., Japanese Patent Laid-Open No. 62-292010.

The logarithmic amplifying circuit in this MOS integrated circuit is designed in such a manner that multi-stage MOS differential amplifiers are connected in cascade, and squaring full-wave rectifiers are respectively connected to an input of the first stage and output terminals of the subsequent stages. With this arrangement, signals at these input and output terminals are subjected to squaring full-wave rectification, and the outputs from the squaring full-wave rectifiers are added together. For this reason, these outputs are affected by the characteristics of the respective squaring full-wave rectifiers, which include dynamic range characteristics, and hence excellent logarithmic characteristics cannot be obtained.

SUMMARY OF THE INVENTION

It is an object of the present invention to provide a logarithmic amplifying circuit which has a wide dynamic range and can obtain excellent logarithmic characteristics.

In order to achieve the above object, according to the present invention, there is provided a logarithmic amplifying circuit comprising a plurality of stages of cascaded differential amplifiers for respectively performing differential amplification of signals from preceding stages and transferring the amplified signals to subsequent stages, a plurality of logarithmic full-wave rectifiers including a plurality of squaring full-wave rectifiers for respectively outputting currents having squaring full-wave rectification characteristics with respect to an input voltage, and adding means for adding the output currents from the squaring full-wave rectifiers and outputting the resultant values, the logarithmic full-wave rectifiers being connected to an input terminal of a first-stage differential amplifier an to output terminals of the respective stages so as to receive voltages at the input terminal of the first stage and at the output terminals of the respective stages and respectively output currents having logarithmic full-wave rectification characteristics with respect to the input voltages, and an adder for adding the output currents from the logarithmic full-wave rectifiers and outputting a signal corresponding to the sum of current.

In addition, the squaring full-wave rectifier comprises a first transistor having a gate connected to a first input terminal of a pair of first and second input terminals for receiving an input voltage, and a source connected to a first current source circuit, a ratio of a gate width to a gate length of the first transistor being set to be a predetermined value, a second transistor having a gate and source respectively connected to the second input terminal and the first current source circuit, a ratio of a gate width to a gate length of the second transistor being set to be different from that of the first transistor, and the second transistor constituting a first differential pair together with the first transistor, a third transistor having a gate and a source respectively connected to the second input terminal and a second current source circuit, a ratio of gate width to gate length of the third transistor being set to be a predetermined value, a fourth transistor having a gate and a source respectively connected to the first input terminal and the second current source circuit, a ratio of gate width to gate length of the fourth transistor being set such that the gate-width/gate-length ratios of the third and fourth transistors are equal to those of the first and second transistors, and the fourth transistor constituting a second differential pair together with the third transistor, a first current mirror circuit having a current input terminal connected to drains of the first and third transistors, and a current output terminal connected to drains of the second and fourth transistors, and a second current mirror circuit having a current input terminal connected to the drains of the second and fourth transistors and to the current output terminal of the first current mirror circuit. Furthermore, the adding means of the logarithmic full-wave rectifiers is constituted by a set of first and second current mirror circuits commonly used for the respective squaring full-wave rectifiers in place of the first and second current mirror circuits of each squaring full-wave rectifier.

DETAILED DESCRIPTION OF PREFERRED EMBODIMENT

The present invention will be described below with reference to accompanying drawings.

Figure 1:
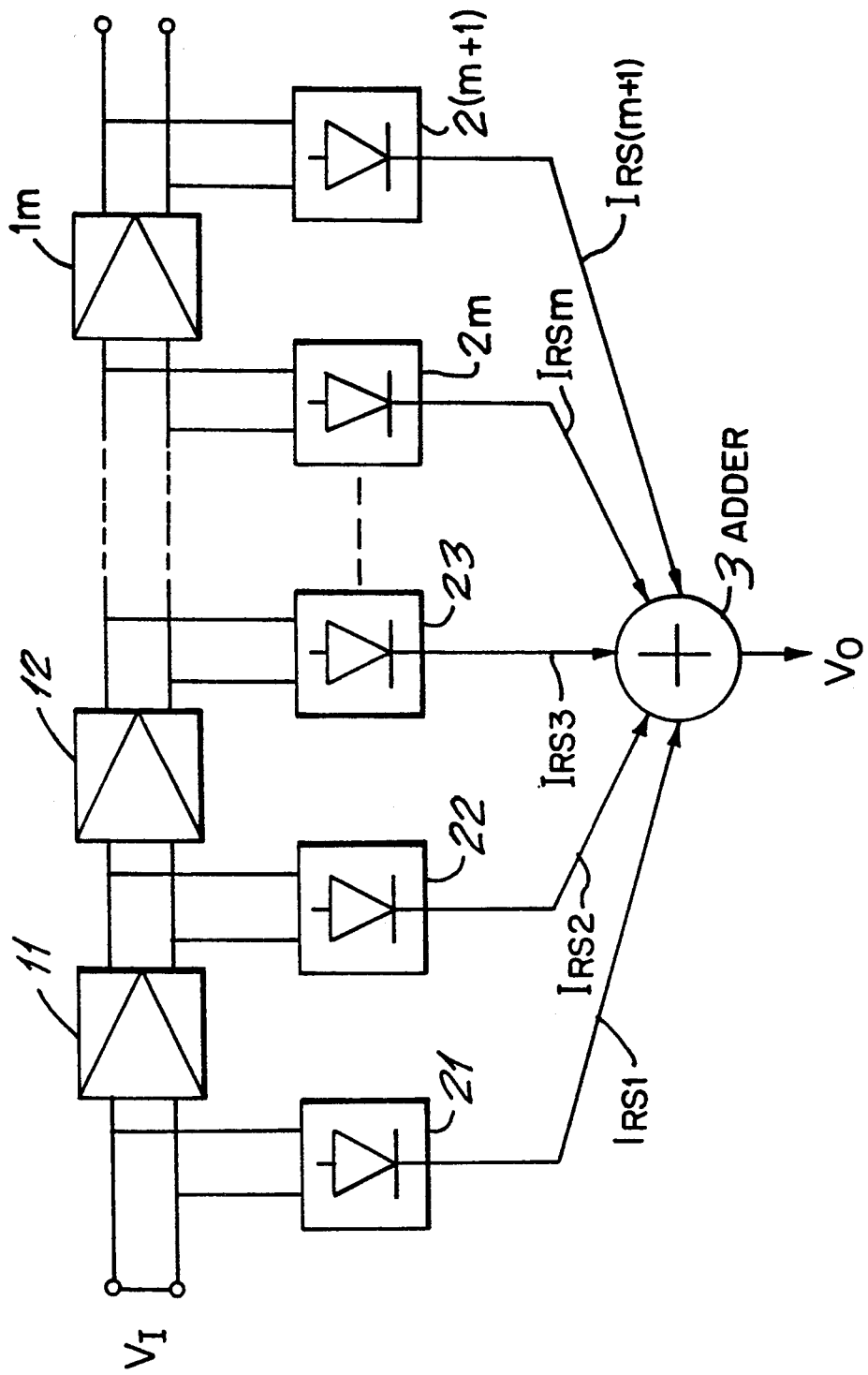
FIG. 1 is a block diagram showing a logarithmic amplifying circuit according to an embodiment of the present invention.

FIG. 1 is a block diagram showing a logarithmic amplifying circuit according to an embodiment of the present invention.

The logarithmic amplifying circuit comprises a plurality of (m) stages of cascaded differential amplifiers 11, 12, ..., and 1m, a plurality of logarithmic full-wave rectifiers 21, 22, ..., and 2(m+1) respectively connected to the input and output terminals of the first-stage differential amplifier 11 and the output terminals of the differential amplifiers 12 to 1m of the subsequent stages and designed to respectively output currents $I_{RSJ}$ (J = 1 to m + 1) having logarithmic full-wave characteristics with respect to an input voltage $V_1$, and an adder 3 for adding the output currents $I_{RSJ}$ from the logarithmic full-wave amplifiers 21, 22, ..., and 2(m+1) and outputting a signal $V_0$ corresponding to the sum current.

Figure 2:
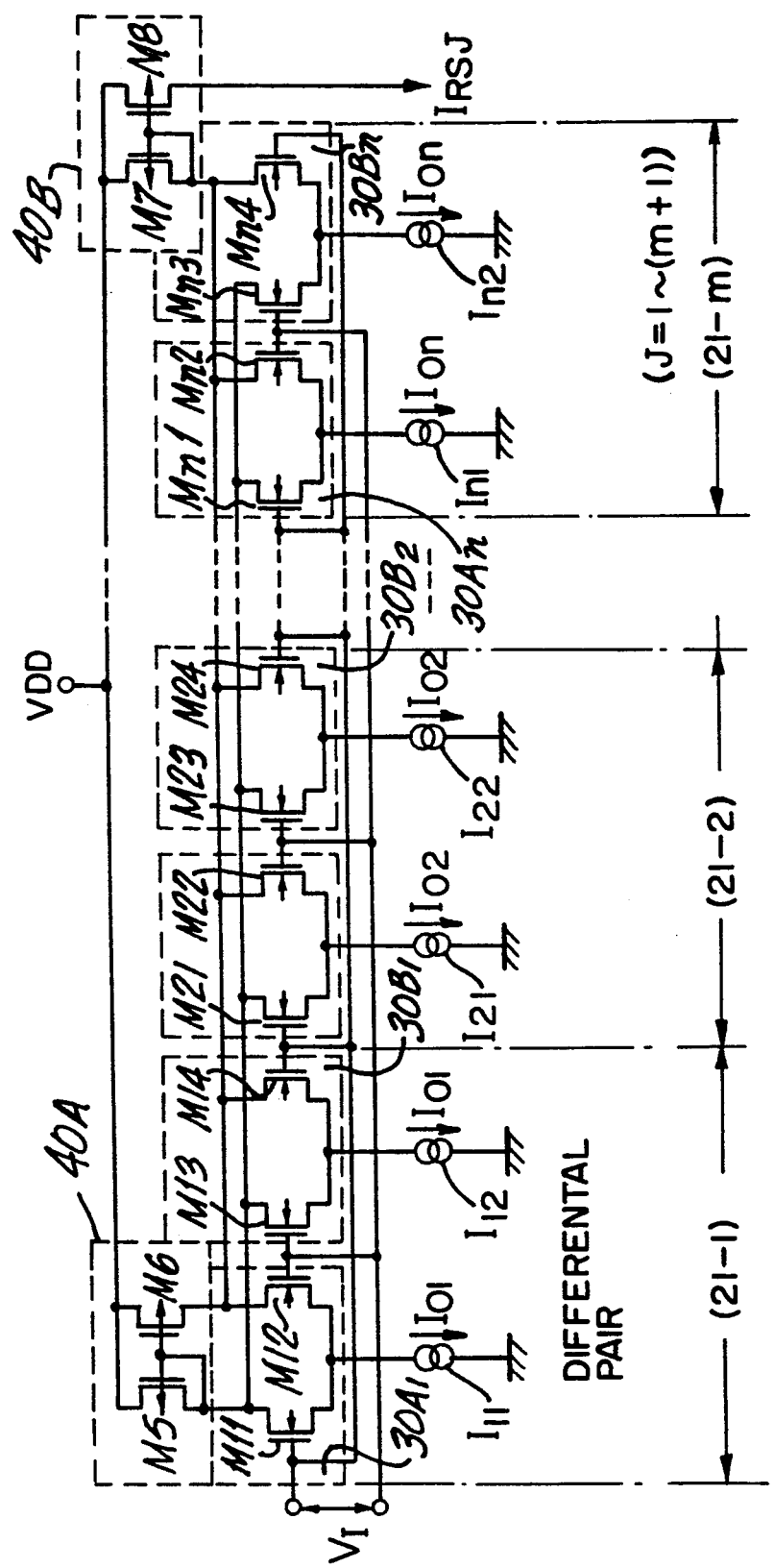
FIG. 2 is a circuit diagram showing a logarithmic full-wave rectifier in the logarithmic amplifying circuit of the present invention.

Since the logarithmic full-wave rectifiers 21, 22, ..., and 2(m+1) of the logarithmic amplifying circuit are all the same in circuitry arrangement, only the logarithmic full-wave rectifier 21 is shown in FIG. 2.

Referring to FIG. 2, the logarithmic full-wave rectifier 21 comprises n squaring full-wave rectifiers (21-1), (21-2), ..., and (21-n), and a pair of current mirror circuits 40A and 40B constituting an addition means for adding output currents from these squaring full-wave rectifiers. Each squaring full-wave rectifier is constituted by a set of two differential pairs. For example, in the squaring full-wave rectifier (21-1), a set of two differential pairs is constituted by differential pairs 30A$_1$ and 30B$_1$. In the squaring full-wave rectifier (21-2), a set of two differential pairs is constituted by differential pairs 30A$_2$ and 30B$_2$.

Figure 3:
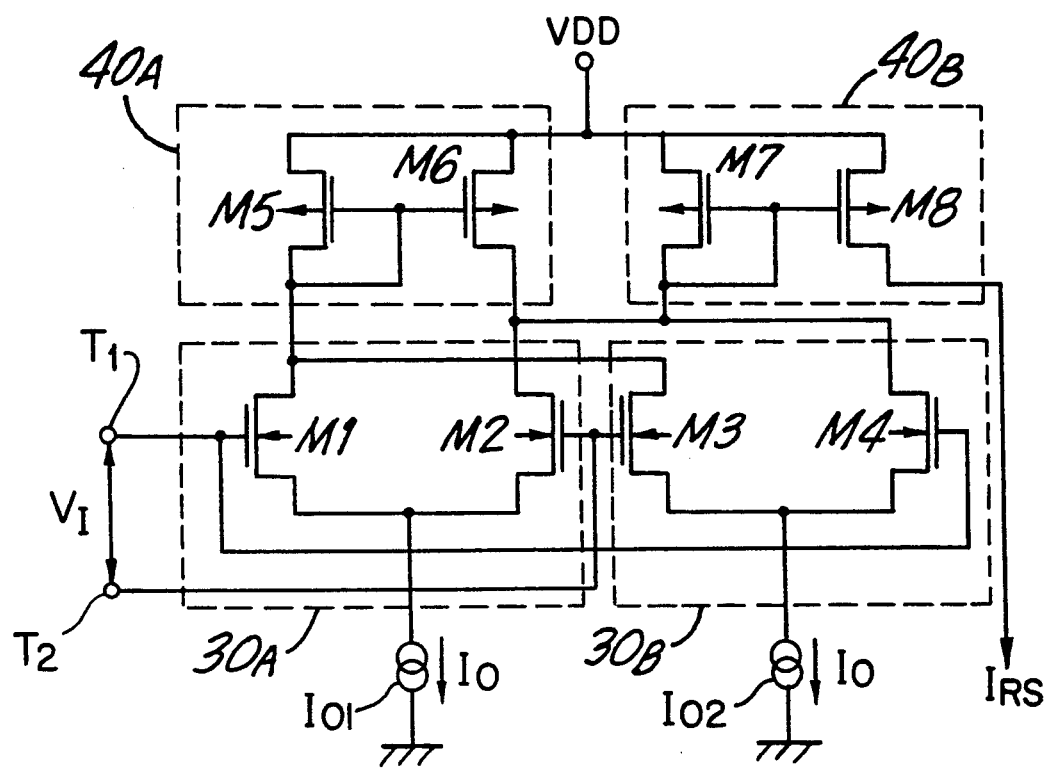
FIG. 3 is a circuit diagram showing a squaring full-wave rectifier, as a basic unit, constituting the logarithmic full-wave rectifier shown in FIG. 2.

Since the squaring full-wave rectifiers are all the same in circuitry arrangement, only one of them is shown in FIG. 3, and its circuit arrangement and operation will be described below.

Referring to FIG. 3, each squaring full-wave rectifier comprises a set of two differential pairs 30A and 30B, and a pair of current mirror circuits 40A and 40B serving as an addition means. The differential pair 30A is constituted by first and second transistors M1 and M2. The gate of the first transistor M1 is connected to a first input terminal T$_1$, one of a pair of first and second input terminals T$_1$ and T$_2$ for receiving an input voltage V$_1$. The source of the transistor M1 is connected to a first current source I$_{01}$. The ratio of the gate width to the gate length of the transistor M1 is set to be a predetermined value. The gate and source of the second transistor M2 are respectively connected to the input terminal T$_2$ and the first current source I$_{01}$. The ratio of the gate width to the gate length of the second transistor M2 is set to be different from that of the first transistor M1. The other differential pair 30B is constituted by third and fourth transistors M3 and M4. The gate and source of the third transistors M3 are respectively connected to the second input terminal T$_2$ and a second current source I$_{02}$. The ratio of the gate width to the gate length of the third transistor M3 is set to be a predetermined value. The gate and source of the fourth transistor M4 are respectively connected to the first input terminal T$_1$ and the second current source I$_{02}$. The ration (W/L) of the gate width to the gate length of the fourth transistor M4 is set such that the ratios (W/L) of the gate-width/gate-length of the third and fourth transistors M3 and M4 are equal to those of the first and second transistors M1 and M2.

The first current mirror circuits 40A comprises transistors M5 and M6. The current input terminals of the current mirror circuit 40A is connected to the drains of the first and third transistors M1 and M3, whereas the current output terminal is connected to the drains of the second and fourth transistors M2 and M4. The second current mirror circuit 40B comprises transistors M7 and M8. The current input terminal of the current mirror circuit 40B is connected to the drains of the second and fourth transistors M2 and M4 and to the current output terminal of the first current mirror circuit 40A.

The squaring full-wave rectifier shown in FIG. 3 requires the pair of current mirror circuits 40A and 40B. However, in the squaring full-wave rectifier shown in FIG. 2 which is constituted by a plurality of differential pairs, the pair of current mirror circuits 40A and 40B is commonly used for all the differential pairs (21-1), (21-2), ..., and (21-n).

An operation of this embodiment and the characteristics of the respective components will be described below.

The squaring full-wave rectifier will be described first.

Drain currents I$_{d1}$, I$_{d2}$, I$_{d3}$, and I$_{d4}$ of the transistors M1, M2, M3, and M4 are obtained as follows. If ratios W/L of gate widths W to gate lengths L of the respective transistors are represented by W$_1$/L$_1$, W$_2$/L$_2$, W$_3$/L$_3$, and W$_4$/L$_4$, then $$(W_2/L_2)/(W_1/L_1)=(W_4/L_4)/(W_3/L_3)=K>1 \quad (1)$$

In this case if $$\beta = \mu_N \frac{C_{ox}}{1} \cdot \frac{W_1}{L_1} \quad (2)$$

where u$_N$ is the mobility of the transistor, and C$_{ox}$ is the gate capacitance of the gate oxide film per unit area, then $$I_{d1} = \beta(V_{gs1} - V_t)^2 \quad (3)$$

$$I_{d2} = K\beta(V_{gs2} - V_t)^2 \quad (4)$$

$$I_{d3} = \beta(V_{gs3} - V_t)^2 \quad (5)$$

$$I_{d4} = K\beta(V_{gs4} - V_t)^2 \quad (6)$$

for $$I_{d1} + I_{d2} = I_{d3} + I_{d4} = I_0 \quad (7)$$

$$V_1 = V_{gs1} - V_{gs2} = V_{gs4} - V_{gs3} \quad (8)$$

where V$_t$ is the threshold voltage of the transistor.

The transistors M5, M6, M7, and M8 constitute the first and second current mirror circuits 40A and 40B, and an output current I$_{RS}$ from this squaring full-wave rectifier is given by $$I_{RS} = (I_{d2} + I_{d4}) - (I_{d1} + I_{d3}) = \quad (9)$$

$$2\frac{K-1}{K+1} I_0 - 4\beta \frac{K(K-1)}{(K+1)^2} V_1^2$$

Figure 4:
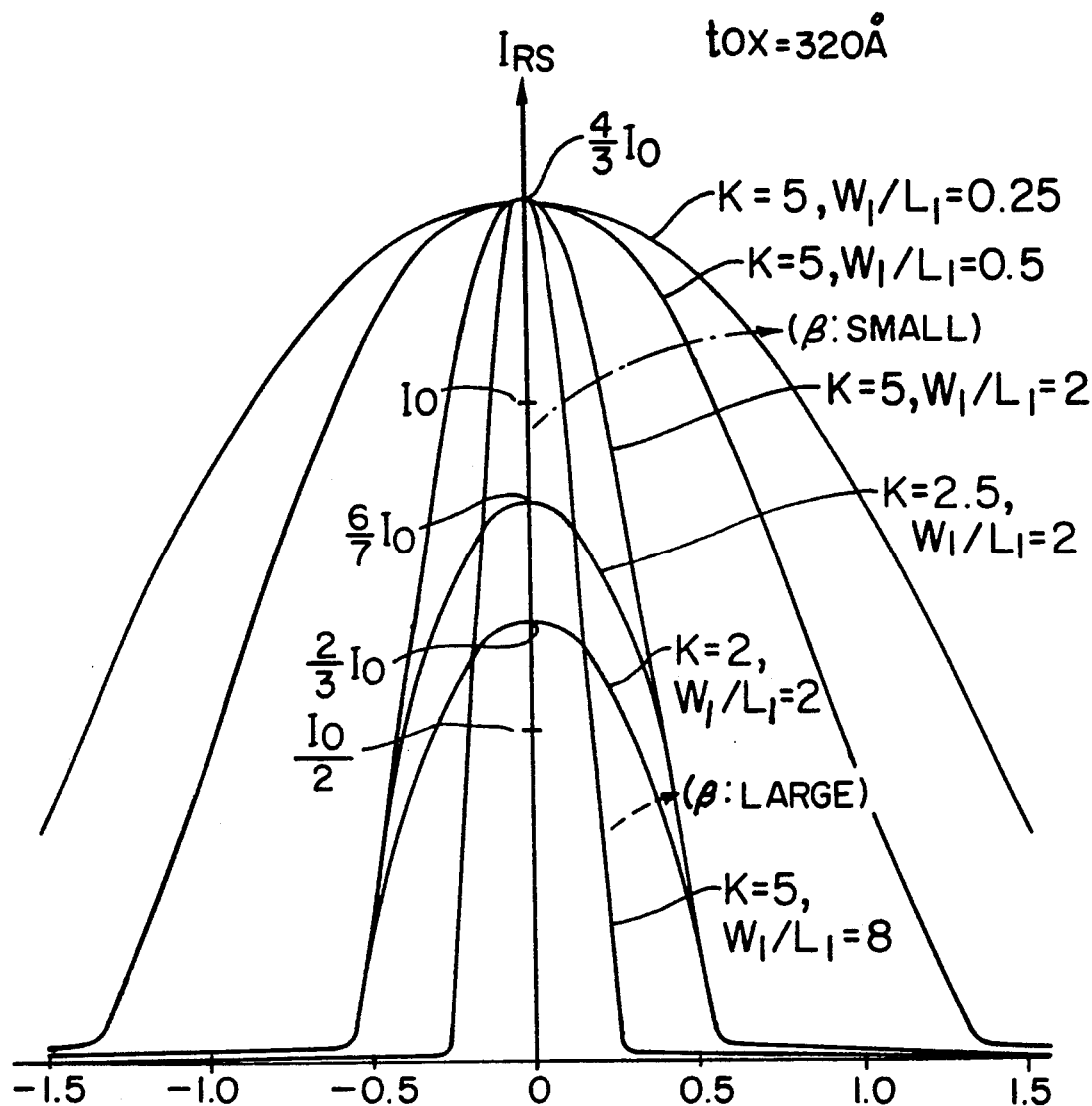
FIGS. 4 and 5 are graphs showing the characteristics of a squaring full-wave rectifier, in which ratio $W_1$ (gate width)/$L_1$ (gate length) is used as a parameter.
Figure 5:
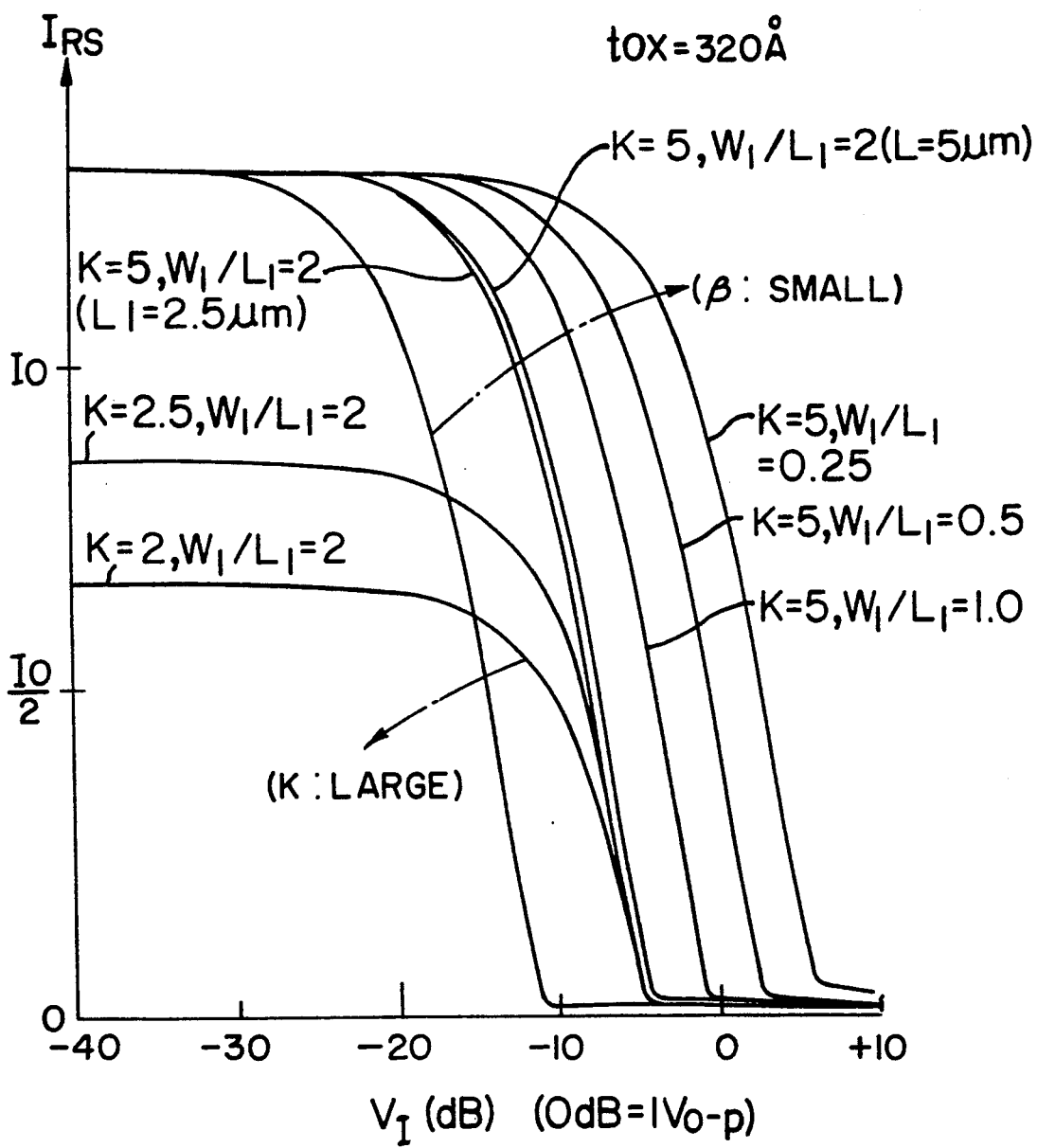

FIG. 4 shows this output current I$_{RS}$ with K and W$_1$/L$_1$ used as parameters. FIG. 5 shows the output current I$_{RS}$ as a function of V(dB).

The current I$_{RSO}$ in equation (9) in the absence of a signal is given by $$I_{RSO} = I_{RS}(V_1 = 0) = 2\frac{K-1}{K+1} I_o \quad (10)$$

The current I$_{RSO}$ monotonously increases with respect to K.

According to equation (9), if I$_{RS}$=0, an operating maximum input voltage V$_{f0}$ is given by $$V_{f0} = \sqrt{1 + \frac{1}{K}} \cdot \sqrt{\frac{I_o}{2\beta}} \quad (11)$$

Even if the value K changes, the range of change is sufficiently compressed. Therefore, the voltage V$_{f0}$ is substantially constant, if K has a large value.

Similarly, an input voltage $V_{I0.5}$ for $I_{RS}=I_{RSO}/2$ is given by $$V_{I0.5} = \frac{1}{2}\sqrt{1+\frac{1}{K}}\cdot\sqrt{\frac{I_o}{\beta}} = \frac{1}{\sqrt{2}}V_{I0} \quad (12)$$

Therefore, the input voltage $V_{I0.5}$ remains substantially constant with respect to a change in K.

The inclination of the current $I_{RS}$ is obtained by differentiating equation (9) as follows:

$$\frac{dI_{RS}}{dV_I} = \frac{-8\beta K(K-1)V_I}{(K+1)^2} \quad (13)$$

For example, when $I_{RS}$ becomes $I_{RSO}$, the corresponding inclination is represented by $$\frac{dI_{RS}}{dV_I}(V_I = V_{I0.5}) = -4\frac{(K-1)}{(K+1)}\sqrt{\frac{K}{K+1}}\sqrt{\beta I_0} \quad (14)$$

That is, the current $I_{RS}$ monotonously decreases with respect to K.

The characteristics of the logarithmic full-wave rectifier 2J (J=1 to m+1) will be described below.

The operating dynamic range of the Xth (X=1 to n) squaring full-wave rectifier constituting the logarithmic full-wave rectifier is represented as the following equations by superposing the product by $P_X$ on $I_{RSX}$, provided that the range of charge in output current $I_{RSX}$ is set to be $(1-2P_X)$ times the current $I_{RSXO}(0<P_X<0.5)$:

$$V_{I1}(1-P_1)=V_{I2}(P_2) \quad (15)$$

$$V_{I2}(1-P_2)=V_{I3}(P_3) \quad (16)$$

$$V_{I(n-1)}\{1-P_{(n-1)}\}=V_{In}(P_n) \quad (17)$$

In this case, $V_{IX}(P_X)$ and $V_{IX}(1-P_X)$ respectively represent input voltages at which the current $I_{RSX}$ is $P_X$ and $(1-P_X)$ times $I_{RSXO}(=I_{RSX}(V_{IX}=0))$.

In this case, an operating dynamic range d of a logarithmic full-wave rectifier 2J is given by $$d=V_{I1}(P_1)/V_{In}(1-P_n) \quad (18)$$

If this value is expressed logarithmically, $$D(dB)=V_{I1}(P_1)(dB)-V_{In}(1-P_n)(dB) \quad (19)$$

According to equations (9) and (10), $$V_{IX}(1-P_X) = \sqrt{\frac{P_X}{2}\cdot\frac{K_X+1}{\beta_X K_X}}I_{OX} \quad (20)$$

$$V_{IX}(P_X) = \sqrt{\frac{1-P_X}{2}\cdot\frac{K_X+1}{\beta_X K_X}}I_{OX} \quad (21)$$

Hence,
Therefore, the dynamic range d is obtained by $$d = \sqrt{\frac{1-P_1}{P_n}}\cdot\sqrt{\frac{K_n(K+1)}{K_1(K_n+1)}}\cdot\sqrt{\frac{I_{01}}{I_{On}}}\cdot\sqrt{\frac{\beta_n}{\beta_1}} \quad (22)$$

For example, if $$K_1=K_2=\ldots=K_n \quad (23)$$

$$I_{01}=I_{02}=\ldots=I_{On} \quad (24)$$

then, $$d = \sqrt{\frac{1-P_1}{P_n}}\sqrt{\frac{\beta_n}{\beta_1}} = \sqrt{\frac{1-P_1}{P_n}}\sqrt{\frac{\beta_n}{\beta_1}} \quad (25)$$

According to equations (15) to (17), $$\frac{P_{(X-1)}}{\beta_{(X-1)}} = \frac{1-P_X}{\beta_X} \quad (26)$$

$$\therefore \frac{\beta_X}{\beta_{(X-1)}} = \frac{1-P_X}{P_{(X-1)}} \quad (27)$$

$$\therefore \frac{\beta_n}{\beta_1} = \frac{\beta_n}{\beta_{(n-1)}}\cdot\frac{\beta_{(n-1)}}{\beta_{(n-2)}}\cdots\frac{\beta_2}{\beta_1} \quad (28)$$

$$= \frac{1-P_n}{P_{(n-1)}}\cdot\frac{1-P_{(n-1)}}{P_{(n-2)}}\cdots\frac{1-P_2}{P_1}$$

$$\therefore d = \sqrt{\frac{1-P_n}{P_n}\cdot\frac{1-P_{(n-1)}}{P_{(n-1)}}\cdots\frac{1-P_2}{P_2}\cdot\frac{1-P_1}{P_1}} \quad (29)$$

The magnitude of a logarithmic characteristic error of the logarithmic full-wave rectifier 2J is determined by $P_X$. In order to reduce the error, the value $P_X$ needs to be increased.

If, for example, $$P_1=P_2=\ldots=P_n=0.1 \quad (30)$$

then, $$\therefore d=3^n \quad (31)$$

If this value is expressed in terms of dB, $$D(dB)=9.54\times n(dB) \quad (32)$$

As a result, an operating dynamic range of 9.54 dB is obtained per squaring full-wave rectifier.

In addition, if $$P_1=P_2=\ldots=P_n=0.2 \quad (33)$$

then, $$d=2^n \quad (34)$$

If this value is expressed in terms of dB, $$d(dB)=6.02\times n(dB) \quad (35)$$

As a result, an operating dynamic range of 6.02 dB is obtained per squaring full-wave rectifier. If the value $P_X$ is increased, the operating dynamic range is reduced. However, since the operating dynamic range is increased n times at the output terminal of the logarithmic full-wave rectifier 2J, an operating dynamic range much wider than that of the conventional circuit can be obtained.

Since output currents $I_{RSJ}$ from the logarithmic full-wave rectifiers 2J having such characteristics are added together by the adder 3, and the sum current is converted into an output voltage $V_0$, the output voltage $V_0$ has a dynamic range of $d^{(m+1)}$. With this operation, excellent logarithmic characteristics with a wide dynamic range and a small error can be obtained.

As has been described above, according to the present invention, logarithmic full-wave rectifiers are respectively connected to the input and output terminals of a plurality of stages full-wave of cascaded differential amplifiers. Each logarithmic full-wave rectifier has a plurality of squaring full-wave rectifiers which perform squaring full-wave rectification of corresponding signals at these input and output terminals. The logarithmic full-wave rectifier adds the outputs from the squaring full-wave rectifiers, and output the sum. The outputs from the respective logarithmic full-wave rectifiers are added together. With this operation, excellent logarithmic characteristics with a wide dynamic range and a small error can be obtained.

What is claimed is:

1. An amplifier comprising:
   a plurality of amplifier stages each having first and second input nodes and first and second output nodes, said amplifier stages being connected to each other in cascaded arrangement such that said first and second output nodes of a preceding amplifier stage are connected respectively to said first and second input nodes of a succeeding amplifier stage, an input signal being supplied between said first and second input nodes of a first stage of said cascaded arrangement;
   a plurality of rectifier blocks, each rectifier block having first and second input terminals connected respectively to said first and second output nodes of an associated one of said amplifier stages to receive an output signal appearing between said first and second output nodes of the associated amplifier stage and rectifying said output signal to produce an output current representative of rectification of said output signal at first and second output terminals thereof, respectively,
   each rectifier block including:
   a first MOS transistor having a gate connected to said first input terminal, a drain connected to said first output terminal, and a source, said first MOS transistor having a first ratio of a gate width to a gate length,
   a second MOS transistor having a gate connected to said second input terminal, a drain connected to said second output terminal, and a source, said second MOS transistor having a second ratio of a gate width to a gate length,
   a third MOS transistor having a gate connected to said second input terminal, a drain connected to said first output terminal, and a source, said third MOS transistor having a third ratio of a gate width to a gate length,
   a fourth MOS transistor having a gate connected to said first input terminal, a drain connected to said second output terminal, and a source, said fourth MOS transistor having a fourth ratio of a gate width to a gate length,
   a first current source connected in common to the sources of said first and second MOS transistors,
   a second current source connected in common to the sources of said third and fourth MOS transistors,
   said first ratio being different from said second ratio, and said third ratio being different from said fourth ratio,
   a first current mirror circuit having a first input node connected to said first output terminal and a first output node connected to said second output terminal,
   a second current mirror circuit having a second input node connected said second output terminal and a second output node, and
   a current output terminal connected to the second output node of said second current mirror circuit to produce an output signal; and
   an adder coupled to said current output terminal of each of said rectifier blocks to add output signals from said rectifier blocks to each other and produce an added output signal of the amplifier.

2. The amplifier as claimed in claim 1, wherein a ratio of said first ratio to said second ratio is equal to a ratio of said third ratio to said fourth ratio.

3. An amplifier comprising a plurality of amplifier stages each having first and second input nodes and first and second output nodes, said amplifier stages being connected to each other in cascaded arrangement such that said first and second output nodes of a preceding amplifier stage are connected respectively to said first and second input nodes of a succeeding amplifier stage, and input signal being supplied between said first and second input nodes of a first stage of said cascaded arrangement;
   a plurality of rectifier blocks, each rectifier block having first and second input terminals connected respectively to said first and second output nodes of an associated one of said amplifier stages to receive an output signal appearing between said first and second output nodes of the associated amplifier stage and rectifying said output signal to produce an output current at first and second output terminals thereof, respectively,
   each rectifier block including first and second MOS transistors connected in a differential manner, said first MOS transistor having a gate connected to said first input terminal, a drain connected to said first output terminal and a first input terminal and a first ratio of a gate width to a gate length, said second MOS transistor having a gate connected to said second input terminal, a drain connected to said second output terminal and a second ratio of a gate width to a gate length, said first ratio being different from said second ratio, third and fourth MOS transistors connected in a differential manner, said third MOS transistor having a gate connected to said second input terminal, a drain connected to said first output terminal and a third ratio of a gate width to a gate length, said fourth MOS transistor having a gate connected to said first input terminal, a drain connected to said second output terminal and a fourth ratio of a gate width to a gate length, said third ratio being different from said fourth ratio, fifth and sixth MOS transistors connected in a differential manner, said fifth MOS transistor having a gate connected to said first input terminal, a drain connected to said first output terminal and a fifth ratio of a gate width to a gate length, said sixth MOS transistor having a gate connected to said second input terminal, a drain connected to said second output terminal and a sixth ratio of a gate width to a gate length, said fifth ratio being different from said sixth ratio, seventh and eighth MOS transistors connected in a differential manner, said seventh MOS transistor having a gate connected to said second input terminal, a drain connected to said first output terminal and a seventh ratio of a gate width to a gate length, said eighth MOS transistor having a gate connected to said first input terminal, a drain connected to said second output terminal and an eighth ratio of a gate width to a gate length, said seventh ratio being different from said eighth ratio, and an output circuit connected to said first and second output terminals to produce an output signal; and an adder connected to said output circuit of each of said rectifier blocks to add output signals from said rectifier blocks to each other and produce an added output signal of the amplifier.

4. The amplifier as claimed in claim 3, wherein a ninth ratio of said first ratio to said second ratio is equal to a tenth ratio of said third ratio to said fourth ratio and an eleventh ratio of said fifth ratio to said sixth ratio is equal to a twelfth ratio of said seventh ratio to said eighth ratio, said ninth ratio being different from said eleventh ratio.

5. The amplifier as claimed in claim 4, wherein said output circuit comprises a first current mirror circuit having a first input node connected to said first output terminal and a first output node connected to said second output terminal, and a second current mirror circuit having a second input node connected to said second output terminal and a second output node from which said output signal is derived.

* * * * *